(12) United States Patent
Xu et al.

(10) Patent No.: US 10,230,001 B2
(45) Date of Patent: Mar. 12, 2019

(54) FIELD EFFECT TRANSISTOR AND METHOD FOR MANUFACTURING THE SAME, AND DISPLAY DEVICE

(71) Applicant: Shenzhen China Star Optoelectronics Technology Co., Ltd., Shenzhen, Guangdong (CN)

(72) Inventors: Hongyuan Xu, Guangdong (CN); Hsiang Chih Hsiao, Guangdong (CN); Chang I Su, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/778,144

(22) PCT Filed: May 19, 2015

(86) PCT No.: PCT/CN2015/079327
§ 371 (c)(1),
(2) Date: Nov. 23, 2016

(87) PCT Pub. No.: WO2016/179849
PCT Pub. Date: Nov. 17, 2016

(65) Prior Publication Data
US 2017/0104104 A1    Apr. 13, 2017

(30) Foreign Application Priority Data
May 8, 2015 (CN) .......................... 2015 1 0232927

(51) Int. Cl.
*H01L 29/786* (2006.01)
*H01L 27/28* (2006.01)
(Continued)

(52) U.S. Cl.
CPC ...... *H01L 29/78648* (2013.01); *H01L 27/283* (2013.01); *H01L 29/42384* (2013.01);
(Continued)

(58) Field of Classification Search
None
See application file for complete search history.

(56) References Cited

U.S. PATENT DOCUMENTS

2007/0262377 A1\* 11/2007 Asa .................. H01L 29/0847
257/345
2007/0278495 A1   12/2007 Kwon et al.
(Continued)

FOREIGN PATENT DOCUMENTS

| CN | 1743930   | 3/2006 |
| CN | 102122620 | 7/2011 |

(Continued)

*Primary Examiner* — Michelle Mandala

(57) ABSTRACT

Disclosed are a field effect transistor and method for manufacturing the same, and a display device. The field effect transistor includes: a source and a drain which are spaced apart from each other; a semi-conductor layer arranged between the source and the drain; a first gate layer located on a side of the semi-conductor layer; and a second gate layer located on the other side of the semi-conductor layer. The field effect transistor provided by the present disclosure is less energy-consuming; a method for manufacturing the same is low costing; and a display device using the same is also less energy-consuming.

14 Claims, 2 Drawing Sheets

(51) Int. Cl.
*H01L 29/423* (2006.01)
*H01L 29/66* (2006.01)
*H01L 51/00* (2006.01)
*H01L 51/05* (2006.01)

(52) U.S. Cl.
CPC .. *H01L 29/66742* (2013.01); *H01L 29/78696* (2013.01); *H01L 51/0097* (2013.01); *H01L 51/0554* (2013.01); *H01L 51/0558* (2013.01)

(56) References Cited

U.S. PATENT DOCUMENTS

| | | | |
|---|---|---|---|
| 2010/0264492 A1* | 10/2010 | Surdeanu | H01L 29/41733 257/348 |
| 2011/0198592 A1 | 8/2011 | Kim et al. | |
| 2012/0154025 A1 | 6/2012 | Chua et al. | |
| 2012/0208318 A1 | 8/2012 | Hoffman et al. | |
| 2013/0234169 A1 | 9/2013 | Kim et al. | |
| 2017/0047535 A1* | 2/2017 | Xu | H01L 51/05 |

FOREIGN PATENT DOCUMENTS

| | | |
|---|---|---|
| CN | 202601619 | 12/2012 |
| CN | 104576747 | 4/2015 |
| CN | 104795496 | 7/2015 |
| WO | 2014146291 | 9/2014 |

\* cited by examiner

FIELD EFFECT TRANSISTOR AND METHOD FOR MANUFACTURING THE SAME, AND DISPLAY DEVICE

CROSS-REFERENCE TO RELATED APPLICATIONS

The present application claims the priority of Chinese patent application CN201510232927.2, entitled "Field effect transistor and method for manufacturing the same, and display device" and filed on May 8, 2015, the entirety of which is incorporated herein by reference.

TECHNICAL FIELD

The present disclosure relates to the technical field of displays, and in particular, to a field effect transistor.

TECHNICAL BACKGROUND

Nowadays, liquid crystal display technologies have been highly developed and have been attached great importance. As the cornerstone of information industry, liquid crystal display technologies are related to a wide range of technologies, and play a critical role in promoting its surrounding industries, and therefore can substantially represent the development and competitiveness of a country's industrialization. A field effect transistor is one of the crucial structures in a display device, and hence the structure and manufacturing process thereof are research emphasis in the field of display devices.

In the existing technologies, the structure of a field effect transistor, especially a thin film transistor, has great influence on the threshold voltage of the field effect transistor, i.e., rendering the threshold voltage large, thus leading to a large energy consumption of the field effect transistor in use, which, obviously, goes against expectations of field effect transistors and blocks its development.

Therefore, it is desirable to provide a less energy-consuming field effect transistor.

SUMMARY OF THE INVENTION

Directed against the above technical problems, the present disclosure provides a field effect transistor which consumes less energy in use. The present disclosure further provides a method for manufacturing a field effect transistor, by means of which a less energy-consuming field effect transistor can be produced. The present disclosure further provides a display device comprising the above field effect transistor which consumes less energy in use.

The present disclosure, at one aspect, provides a field effect transistor which comprises: a source and a drain which are spaced apart from each other; a semi-conductor layer arranged between the source and the drain; a first gate layer located on a side of the semi-conductor layer; and a second gate layer located on the other side of the semi-conductor layer.

According to the field effect transistor provided by the present disclosure, both sides of the semi-conductor layer are provided with a gate layer. When the gate layers on both sides of the semi-conductor layer are energized, charge carriers will be produced on both sides of the semi-conductor layer which respectively face the two gate layers, and even inside the semi-conductor layer, thus increasing the number of conducting channels activated in the semi-conductor layer. In this manner, a threshold voltage is decreased, which reduces the electric energy which is required for causing the field effect transistor provided by the present disclosure to be in an ON-state, thereby decreasing the energy consumption of the field effect transistor provided by the present disclosure. Besides, this structure is also able to increase an on-state current of the field effect transistor, thereby improving the working efficiency of the field effect transistor. Moreover, the structure is also capable of decreasing an off-state voltage of the field effect transistor, and further reducing the energy consumption of the field effect transistor.

In one embodiment, a projection of the first gate layer covers the source and the drain in a perpendicular direction. With such a structure, the source, the drain, and the semi-conductor between the source and the drain can be protected from light, thereby effectively reducing the off-state current.

In one embodiment, the first gate layer and the semi-conductor layer are spaced apart by a first isolating layer, and the second gate layer and the semi-conductor layer are spaced apart by a second isolating layer. Such an arrangement is able to lead to a steady structure of the field effect transistor provided by the present disclosure, thereby decreasing the threshold voltage of the field effect transistor, increasing the on-state current, and decreasing the off-state current.

In one embodiment, a projection of the second gate layer covers the source and the drain in a perpendicular direction. With such a structure, the source, the drain, and the semi-conductor between the source and the drain can be protected from light, thereby effectively reducing the off-state current.

In one embodiment, the semi-conductor layer extends to accommodate the source and the drain. Such an arrangement is easily to be achieved in the manufacturing process, and enables the source and the drain to be protected by the semi-conductor layer.

In one embodiment, a projection of the first gate layer covers the semi-conductor layer in a perpendicular direction. With such a structure, the semi-conductor layer can be protected from light, thereby decreasing the off-current effectively.

In one embodiment, a projection of the second gate layer covers the semi-conductor layer in a perpendicular direction. With such a structure, the semi-conductor layer can be protected from light, thereby decreasing the off-current effectively.

The present disclosure, at another aspect, provides a method for manufacturing the above field effect transistor. The method comprises the following steps. A first gate layer is provided thereon with a complete semi-conductor base film which is provided with a photoresist on one side thereof, the semi-conductor base film being non-opaque, and the first gate layer being opaque. The photoresist is exposed with the first gate layer as a mask, so as to form a predetermined pattern. A semi-conductor layer is formed from the semi-conductor base film based on the predetermined pattern. By using this method, the manufacturing cost of the field effect transistor can be effectively reduced.

In one embodiment, the semi-conductor base film is further provided with a second insulating base film on a side thereof facing away the first gate layer. The second insulating base film is provided with a photoresist on a side thereof facing away the semi-conductor base film, and the second insulating base film is non-opaque. The photoresist is exposed with the first gate layer as a mask, so as to form a predetermined pattern. The semi-conductor layer is formed from the semi-conductor base film based on the predetermined pattern, and a second insulating layer is formed from the second insulating base film. By using this method, the manufacturing cost of the field effect transistor can be effectively reduced.

The present disclosure, at another aspect, provides a display device comprising the above field effect transistor. The display device is less energy-consuming.

Compared with the existing technologies, the present disclosure has the following advantages. (1) When the gate layers on both sides of the semi-conductor layer are energized, the semi-conductor layer covering the source and the drain generates charge carriers on its two sides which respectively face the first gate layer and the second gate layer, thus increasing the number of conducting channels activated in the semi-conductor layer. In this manner, a threshold voltage is decreased, which reduces the electric energy which is required for causing the field effect transistor provided by the present disclosure to be in an ON-state, thereby decreasing the energy consumption of the field effect transistor provided by the present disclosure. (2) The above structure is also able to increase the on-state current of the field effect transistor, thereby improving the working efficiency of the field effect transistor. (3) The structure is also capable of decreasing the off-state voltage of the field effect transistor, and further reducing the energy consumption of the field effect transistor.

BRIEF DESCRIPTION OF THE DRAWINGS

The present disclosure will be further illustrated in detail with reference to the following embodiments and the accompanying drawings.

In the accompanying drawings, same components are indicated using same reference signs. The drawings are not drawn to scale.

DETAILED DESCRIPTION OF THE EMBODIMENTS

The present disclosure will be explained further in detail with reference to the accompanying drawings.

It should be noted that in this text, the words "upper" and "lower" both indicate a relative direction. For example, when the semi-conductor layer 50 is referred to, the side thereof facing the first gate layer 20 is a lower side, and the side thereof facing the second gate layer 70 is an upper side.

In addition, the "perpendicular direction" herein refers to a direction from the first gate layer 20 to the second gate layer 70 or vice versa. "A projection in a perpendicular direction" means that the projection is in the plane of the first gate layer, or in a plane parallel to the plane of the first gate layer.

FIGS. 1 to 7 schematically show the process of manufacturing a field effect transistor 100 provided by the present disclosure. The method for manufacturing the field effect transistor is as follows.

Figure 1:
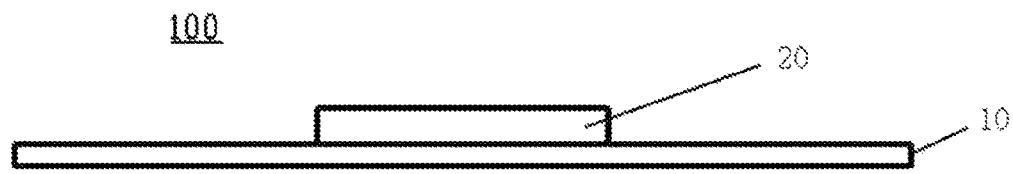
FIG. 1 shows the first step of a method for manufacturing a field effect transistor provided by the present disclosure.

As shown in FIG. 1, a metal layer is formed on a substrate 10 by means of sputtering, and the metal layer then forms a first gate layer 20 as shown in FIG. 1 after being photo-etched.

Figure 2:
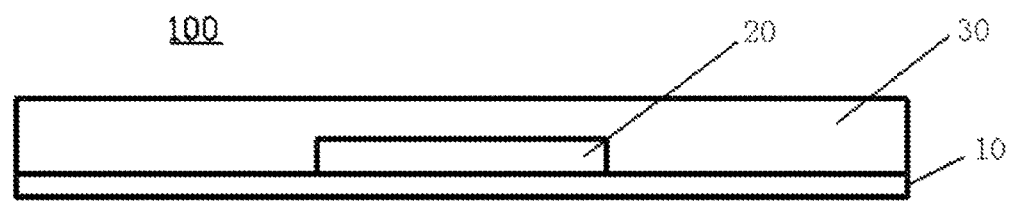
FIG. 2 shows a subsequent step of the step for manufacturing the field effect transistor provided by the present disclosure according to FIG. 1.

As shown in FIG. 2, the substrate 10 and the first gate layer 20 are coated with a first insulating layer 30.

Figure 3:
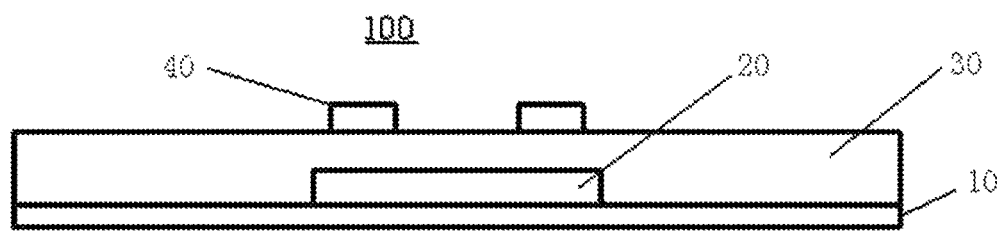
FIG. 3 shows a subsequent step of the step for manufacturing the field effect transistor provided by the present disclosure according to FIG. 2.

As shown in FIG. 3, a metal layer is formed on the first insulating layer 30 by means of sputtering, and the metal layer then forms a source-drain layer 40 as shown in FIG. 3 after being photo-etched. The source-drain layer 40 comprises a source and a drain which are spaced apart from each other.

Figure 4:
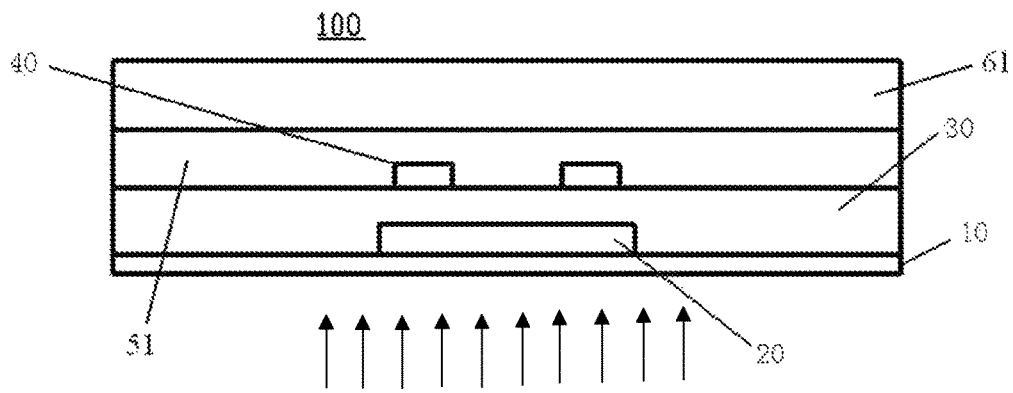
FIG. 4 shows a subsequent step of the step for manufacturing the field effect transistor provided by the present disclosure according to FIG. 3.

As shown in FIG. 4, the source-drain layer 40 and the first insulating layer 30 are coated with a complete semi-conductor base film 51. Preferably, a second complete insulating base film 61 is further coated on the semi-conductor base film 51.

In this embodiment, the first insulating layer 30, the semi-conductor base film 51, and the second insulating base film 61 are all non-opaque, and the first gate layer 20 is opaque.

Figure 5:
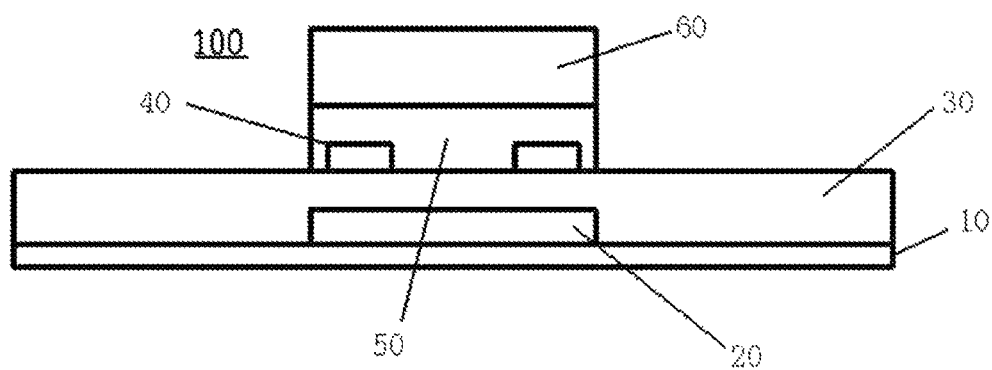
FIG. 5 shows a subsequent step of the step for manufacturing the field effect transistor provided by the present disclosure according to FIG. 4.

If the second insulating base film 61 is not provided, a photoresist should be coated on the semi-conductor base film 51. If the second insulating base film 61 is provided, the photoresist should be coated on the second insulating base film 61. As shown in FIG. 4, the field effect transistor 100 is illuminated from the lower side thereof to expose the photoresist provided on a semi-conductor layer 50 and/or a second insulating layer 60, so that the photoresist can form a predetermined pattern. Then, the semi-conductor layer 50 and/or the second insulating layer 60 as shown in FIG. 5 are/is formed by etching based on the predetermined pattern. In the process of forming the semi-conductor layer 50 and/or the second insulating layer 60, the photoresist is exposed with the first gate layer 20 as the mask, and therefore it is not necessary to prepare a mask again, which saves the cost of manufacturing the field effect transistor 100 accordingly.

Figure 6:
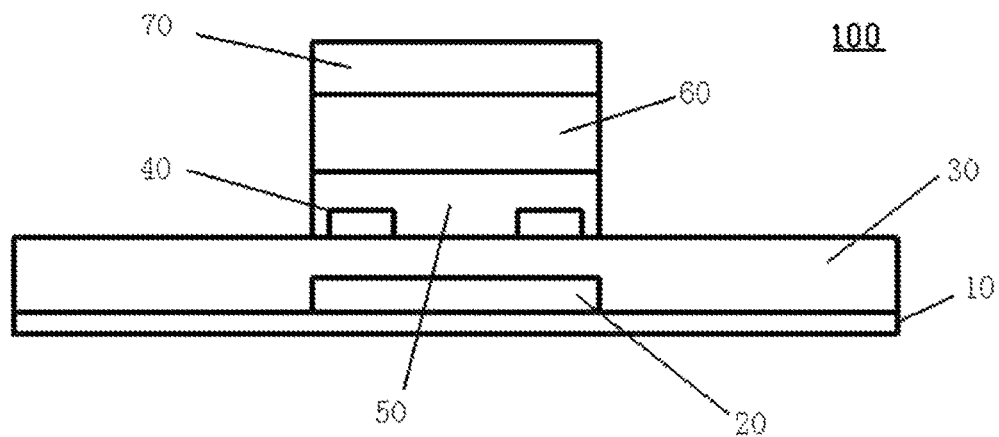
FIG. 6 shows a subsequent step of the step for manufacturing the field effect transistor provided by the present disclosure according to FIG. 5.

As shown in FIG. 6, a metal layer is formed on the second insulating layer 60 by sputtering, and the metal layer then forms a second gate layer 70 as shown in FIG. 6 after being photo-etched.

Figure 7:
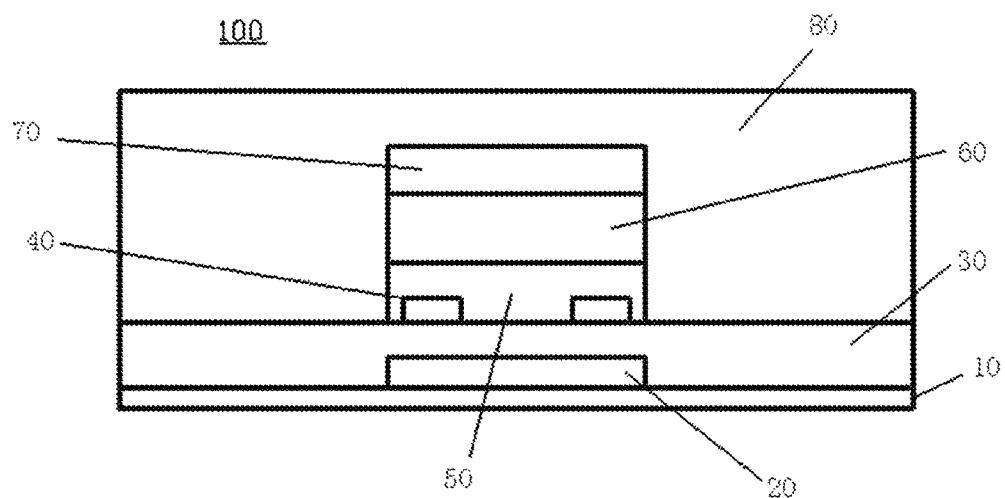
FIG. 7 schematically shows the structure of the field effect transistor provided by the present disclosure, and shows a subsequent step of the step for manufacturing the field effect transistor provided by the present disclosure according to FIG. 6.

As shown in FIG. 7, the second gate layer 70 is coated thereon with a protecting layer 80. Preferably, the protecting layer 80 completely covers the field effect transistor 100 as a whole.

FIG. 7 also schematically shows the structure of the field effect transistor 100 provided by the present disclosure.

The field effect transistor 100 provided by the present disclosure comprises a source-drain layer 40 including a source and a drain which are spaced apart from each other. The field effect transistor 100 further comprises a semi-conductor layer 50 located between the source and the drain. When the field effect transistor 100 is energized, charge carriers will be produced in the semi-conductor layer 50, and conducting channels will correspondingly be formed in the semi-conductor layer 50.

Preferably, as shown in FIG. 7, the semi-conductor layer 50 can be extended to completely accommodate the source and the drain and cover the source and the drain from one side. The semi-conductor layer 50 with such a structure can be easily produced, and is good in producing the charge carriers.

The field effect transistor 100 further comprises a first gate layer 20 below the source-drain layer 40, and a second gate layer 70 above the source-drain layer 40. The first gate layer 20 and the second gate layer 70 are spaced apart from the source-drain layer 40 and the semi-conductor layer 50.

When the field effect transistor 100 is energized, the first gate layer 20 and the second gate layer 70 located on the two sides of the semi-conductor layer 50 are able to produce charge carriers at both surfaces of the semi-conductor layer 50 between the source and the drain, which increases the number of conducting channels activated in the semi-conductor layer 50. Preferably, charge carriers are not only produced at the two surfaces of the semi-conductor layer 50 between the source and the drain, but also produced inside the semi-conductor layer 50. That is, the semi-conductor layer 50 arranged between the source and the drain can be filled with charge carriers, which can further increase the number of conducting channels activated in the semi-conductor layer 50. In this manner, a threshold voltage of the field effect transistor 100 can be decreased, which reduces a voltage which is required for causing the field effect transistor 100 to be in an ON-state, thereby decreasing the energy consumption of the field effect transistor 100. Besides, an on-state current of the field effect transistor 100 can be increased, which accelerates the charge and discharge velocities of the field effect transistor 100, thereby improving the working efficiency of the field effect transistor 100. Moreover, an off-state voltage of the field effect transistor can be decreased as well, which can further reduce the energy consumption of the field effect transistor 100.

In one embodiment, the first gate layer 20 is provided on the substrate 10, and the first gate layer 20 is coated thereon with a first insulating layer 30 which is coated with the source-drain layer 40 and the semi-conductor layer 50. This arrangement is steady in nature, and therefore provides a foundation for manufacturing a low energy-consuming field effect transistor 100.

As shown in FIG. 7, the first gate layer 20 completely covers the source and the drain, which prevents the light, coming from the side where the first gate layer 20 is arranged, from illuminating directly on the source and the drain as well as the semi-conductor layer 50 therebetween, thereby decreasing the off-state current of the field effect transistor 100.

Preferably, in the case that the semi-conductor layer 50 extends to accommodate the source and the drain, the first gate layer 20 completely covers the semi-conductor layer 50. In this manner, light coming from a side where the first gate layer 20 is arranged can be prevented from illuminating directly on the source and the drain as well as the semi-conductor layer 50, thereby decreasing the off-state current of the field effect transistor 100.

As shown in FIG. 7, the field effect transistor 100 further comprises a second insulating layer 60 which is arranged between the semi-conductor layer 50 and the second gate layer 70. Such a structure ensures the stability of the field effect transistor 100, and therefore provides a foundation for manufacturing a low energy-consuming field effect transistor 100.

As shown in FIG. 7, the second gate layer 70 completely covers the source and the drain, which prevents light, coming from a side where the second gate layer 70 is arranged, from illuminating directly on the source and the drain as well as the semi-conductor layer 50 therebetween, thereby effectively decreasing the off-state current of the field effect transistor 100.

Preferably, in the case that the semi-conductor layer 50 extends to accommodate the source and the drain, the second gate layer 70 completely covers the semi-conductor layer 50. In this manner, light coming from a side where the second gate layer 70 is arranged can be prevented from illuminating directly on the source and the drain as well as the semi-conductor layer 50, thereby further decreasing the off-state current of the field effect transistor 100.

Meanwhile, through covering the semi-conductor layer 50 by the first gate layer 20 and the second gate layer 70, light coming from both sides of the filed effect transistor can be effectively prevented from illuminating on the semi-conductor layer 50. In a display device, especially one using the field effect transistor 100, the first gate layer 20 can prevent the light from a backlight source, and the second gate layer 70 can prevent the light from a front light source (namely natural light). This structure capable of shielding light can decrease the off-state voltage to minimum.

A protecting layer 80 is provided on the second gate layer 70. Preferably, the protecting layer 80 covers the field effect transistor 100 completely so as to ensure the structural stability of the field effect transistor 100.

When being used in a display device, the field effect transistor 100 provided by the present disclosure is a thin film transistor. Besides, the field effect transistor 100 provided by the present disclosure is especially suitable to be used in a flexible display device, where the field effect transistor 100 is an organic thin film transistor. When the field effect transistor severs as an organic thin film transistor, the substrate 10 can be formed from a material such as polyethylene naphthalate (PEN), polyethylene terephthalate (PET), or polyimide (PI).

The field effect transistor 100 provided by the present disclosure is less energy-consuming, and the threshold thereof can even be close to zero. A display device using the above field effect transistor 100 will accordingly be less energy-consuming. Preferably, in the present disclosure, by applying voltages at a same potential on the first gate layer 20 and the second gate layer 70, the energy consumption of the field effect transistor 100 can be reduced to minimum in the simplest way.

The present disclosure has been described with reference to the preferred embodiments, but without departing from the spirit and scope of the present disclosure, anyone skilled in the art can make any amendment to the present disclosure, and substitute any components with equivalents thereof. In particular, as long as there is no structural conflict, any of the technical features in any of the embodiments may be combined with one another. The present disclosure is not restricted by the embodiments disclosed herein, and contains all the technical solutions which fall within the scope of the claims.

The invention claimed is:
1. A field effect transistor, comprising:
   a source and a drain which are spaced apart from each other,
   a semi-conductor layer arranged between the source and the drain,
   a first gate layer located on one side of the semi-conductor layer, and
   a second gate layer located on the other side of the semi-conductor layer, wherein a projection of the first gate layer completely covers the source and the drain in a perpendicular direction, wherein the first gate layer is opaque.

2. The field effect transistor according to claim 1, wherein the first gate layer and the semi-conductor layer are spaced apart by a first isolating layer, and the second gate layer and the semi-conductor layer are spaced apart by a second isolating layer.

3. The field effect transistor according to claim 2, wherein a projection of the second gate layer covers the source and the drain in a perpendicular direction.

4. The field effect transistor according to claim 1, wherein the semi-conductor layer extends to accommodate the source and the drain.

5. The field effect transistor according to claim 4, wherein a projection of the first gate layer covers the semi-conductor layer in a perpendicular direction.

6. The field effect transistor according to claim 4, wherein a projection of the second gate layer covers the semi-conductor layer in a perpendicular direction.

7. A method for manufacturing a field effect transistor, comprising steps of:

providing a first gate layer thereon with a semi-conductor base film, which is provided with a photoresist on a side thereof facing away the first gate layer, the semi-conductor base film being non-opaque, and the first gate layer being opaque, exposing the photoresist with the first gate layer as a mask, so as to form a pattern, and forming a semi-conductor layer from the semi-conductor base film based on the pattern, wherein the field effect transistor comprising:

a source and a drain which are spaced apart from each other, a semi-conductor layer arranged between the source and the drain, a first gate layer located on one side of the semi-conductor layer, and a second gate layer located on the other side of the semi-conductor layer, wherein a projection of the first gate layer completely covers the source and the drain in a perpendicular direction.

8. The method according to claim 7, further comprising:

providing a second insulating base film on a side of the semi-conductor base film facing away the first gate layer, and providing a photoresist on a side of the second insulating base film facing away the semi-conductor base film, the second insulating base film being non-opaque, exposing the photoresist with the first gate layer as the mask, so as to form the pattern, and forming the semi-conductor layer from the semi-conductor base film based on the pattern, and forming a second insulating layer from the second insulating base film.

9. A display device, comprising a field effect transistor which comprises:

a source and a drain which are spaced apart from each other, a semi-conductor layer arranged between the source and the drain, a first gate layer located on one side of the semi-conductor layer, and a second gate layer located on the other side of the semi-conductor layer, wherein a projection of the first gate layer completely covers the source and the drain in a perpendicular direction, wherein the first gate layer is opaque.

10. The display device according to claim 9, wherein the first gate layer and the semi-conductor layer are spaced apart by a first isolating layer, and the second gate layer and the semi-conductor layer are spaced apart by a second isolating layer.

11. The display device according to claim 10, wherein a projection of the second gate layer covers the source and the drain in a perpendicular direction.

12. The display device according to claim 9, wherein the semi-conductor layer extends to accommodate the source and the drain.

13. The display device according to claim 12, wherein a projection of the first gate layer covers the semi-conductor layer in a perpendicular direction.

14. The display device according to claim 12, wherein a projection of the second gate layer covers the semi-conductor layer in a perpendicular direction.

* * * * *